(12) United States Patent
Tanaka et al.

(10) Patent No.: US 7,122,855 B2
(45) Date of Patent: Oct. 17, 2006

(54) SEMICONDUCTOR MEMORY DEVICE AND METHOD OF MANUFACTURING THE SAME

(75) Inventors: Toshiharu Tanaka, Yokohama (JP); Masaru Kito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 10/901,996

(22) Filed: Jul. 30, 2004

(65) Prior Publication Data

US 2005/0110067 A1 May 26, 2005

(30) Foreign Application Priority Data

Nov. 21, 2003 (JP) ............... 2003-393037

(51) Int. Cl.
*H01L 27/108* (2006.01)
*H01L 21/20* (2006.01)
(52) U.S. Cl. ............... 257/301; 257/E27.092; 438/243; 438/386
(58) Field of Classification Search ........... 257/301, 257/302
See application file for complete search history.

(56) References Cited

U.S. PATENT DOCUMENTS 5,998,821 A * 12/1999 Hieda et al. ............... 257/301
6,008,513 A * 12/1999 Chen ............... 257/296
2005/0110067 A1 5/2005 Tanaka et al.

FOREIGN PATENT DOCUMENTS

JP 2002-118240 4/2002

OTHER PUBLICATIONS

U.S. Appl. No. 11/311,268, filed Dec. 20, 2005, Kito et al.

* cited by examiner

*Primary Examiner*—Long Tran
(74) *Attorney, Agent, or Firm*—Oblon, Spivak, McClelland, Maier & Neustadt, P.C.

(57) ABSTRACT

A semiconductor memory device includes a trench formed in the semiconductor substrate, a diffusion layer for a first electrode formed within the semiconductor substrate so as to be in contact with an inner surface of the trench, a capacitor insulating film formed on the diffusion layer, a conductive layer for a second electrode formed so as to bury a lower portion of the trench, a first insulating film formed on the conductive layer and along a side surface of the trench, a first conductive layer formed so as to bury an intermediate portion of the trench, a first contact layer formed so as to bury an upper portion of the trench, and a second contact layer formed on the surface of the semiconductor substrate so as to be in contact with the first contact layer.

11 Claims, 5 Drawing Sheets

SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2003-393037, filed Nov. 21, 2003, the entire contents of which are incorporated herein by reference.

BACKGROUND OF THE INVENTION

1. Field of the Invention

The present invention relates to a semiconductor memory device and a method of manufacturing the semiconductor memory, and more particularly, to a structure of a semiconductor memory device having a trench capacitor in a memory cell and a method of manufacturing the semiconductor memory.

2. Description of the Related Art

The integration level of a semiconductor integrated circuit has been increased year by year. This tendency is remarkably observed in a dynamic random access memory (DRAM). To increase the integration level of a DRAM cell having a single transistor and a single capacitor, the size of each part must be reduced. As a DRAM cell is reduced in size, a wiring layer connecting a source diffusion layer (or drain diffusion layer) of a transistor and a capacitor electrode is also reduced in area and width. As a result, it becomes difficult for the DRAM cell to maintain requisite electrical characteristics.

Now, the structure of a DRAM having a trench capacitor will be described by way of example. FIG. 9 is a sectional view showing the essential portion of a conventional DRAM. A semiconductor substrate 30 has a trench 31 formed therein. Around the lower portion of the trench 31 within the semiconductor substrate 30, a plate electrode 32 of an N-type diffusion layer is formed as a capacitor electrode. On the lower inner surface of the trench 31, an NO film 33 (formed of a silicon nitride film and a silicon oxide film) serving as a dielectric film of a capacitor is formed.

Inside the NO film 33 of the trench 31, a polysilicon layer 34 serving as an upper electrode of the capacitor is formed. On the polysilicon layer 34 and along the inner surface of the trench, a collar oxide film 35 is formed to separate a transistor region to be formed in the semiconductor substrate 30 and a storage node of the trench capacitor. Inside the collar oxide film 35 of the trench 31, a polysilicon layer 36 serving as a wiring layer is formed in contact with the polysilicon layer 34.

On the polysilicon layer 36, a buried strap (BS) contact layer 37 serving as a contact layer connecting between the source diffusion layer 17 of a memory-cell transistor and the polysilicon layer 36 is formed. The BS contact layer 37 is buried in the trench until it is flush with the surface of the semiconductor substrate 30.

On the semiconductor substrate 30, a gate electrode 14 is formed with a gate insulating film 13 interposed between them. Around the gate electrode 14, a gate cap insulating film 15 is formed so as to cover the gate electrode 14. On both side surfaces of the gate cap insulating film 15, a gate sidewall insulating film 16 is formed. A source diffusion layer 17 and a drain diffusion layer 18 are formed in the semiconductor substrate 1 underneath both sides of the gate electrode 14, respectively.

In the DRAM thus constructed, when a BS contact is formed, usually a frontage of about 1200 to 1500 Å (more specifically, the depth of the BS contact in contact with a side surface of the active area in which the memory cell transistor is to be formed) is maintained. However, as the size of the DRAM cell is reduced, it becomes difficult to suppress the punch through caused by impurities diffused from the BS contact layer to the source diffusion layer 17. Furthermore, as the cell size is reduced, the volume of the BS contact layer or the frontage of the BS contact layer decreases, with the result that the resistance value of the BS contact layer increases.

As one of solutions to these problems, it may be considered to employ a surface strap (SS) contact, which is a strap contact layer formed on the surface of the semiconductor substrate. However, when the SS contact layer is formed, a trench top oxide (TTO) film formed on the top of a trench capacitor must be etched back to expose the polysilicon layer 36 serving as a wiring layer. In the etching-back step, the collar oxide film formed on the sidewall of a trench is inevitably etched at the same time. When the SS contact layer is formed by burying, for example, polysilicon, a recess formed in the sidewall of the trench is not sufficiently buried with the polysilicon, with the result that a void and the like may be produced. When a void is formed, a film may be peeled off or the resistance value of the BS contact layer may be increased.

When the SS contact layer is formed not by burying polysilicon but by the epitaxial growth of silicon, a recess of sidewall of a trench may not be sufficiently bridged by the growth of silicon crystal, or alternatively, the silicon substrate or a polysilicon layer is deformed by migration of the crystal when a native oxide film is removed by hydrogen annealing.

As a relevant technique, it has been proposed to form an analogous structure to a DRAM without increasing the area by employing a gain cell having a trench structure (refer to Japanese Patent Application KOKAI No. 2002-118240).

BRIEF SUMMARY OF THE INVENTION

According to a first aspect of the present invention, there is provided a semiconductor memory device comprising: a semiconductor substrate; a trench formed in the semiconductor substrate; a diffusion layer for a first electrode, formed within the semiconductor substrate so as to be in contact with an inner surface of the trench; a capacitor insulating film formed on the diffusion layer exposed as the inner surface of the trench; a conductive layer for a second electrode, formed on the capacitor insulating film so as to bury a lower portion of the trench; a first insulating film formed on the conductive layer and along a side surface of the trench; a first conductive layer formed on a side surface of the first insulating film and on the conductive layer so as to bury an intermediate portion of the trench; a first contact layer formed on the first insulating film and on the first conductive layer so as to bury an upper portion of the trench; a second contact layer formed on a surface of the semiconductor substrate so as to be in contact with the first contact layer; and a transistor having a source and a drain formed in the semiconductor substrate, either one of which is in contact with the first and second contact layer.

According to a second aspect of the present invention, there is provided a method of manufacturing a semiconductor memory device comprising: forming a trench in a semiconductor substrate; forming a diffusion layer for a first electrode in the semiconductor substrate so as to be in contact with an inner surface of the trench; forming a capacitor insulating film on the diffusion layer exposed as the inner surface of the trench; forming a conductive layer for a second electrode on the capacitor insulating film so as to bury a lower portion of the trench; forming a first insulating film on the conductive layer and along a side surface of the trench; forming a first conductive layer on a side surface of the first insulating film and on the conductive layer so as to bury an intermediate portion of the trench; forming a first contact layer on the first insulating film and the first conductive layer so as to bury an upper portion of the trench; forming a transistor having a source and a drain on the surface of the semiconductor substrate, either one of the source and drain being in contact with the first contact layer; and forming a second contact layer on the surface of the semiconductor substrate so as to be in contact with the first contact layer and the either one of the source and drain.

DETAILED DESCRIPTION OF THE INVENTION

Figure 1:
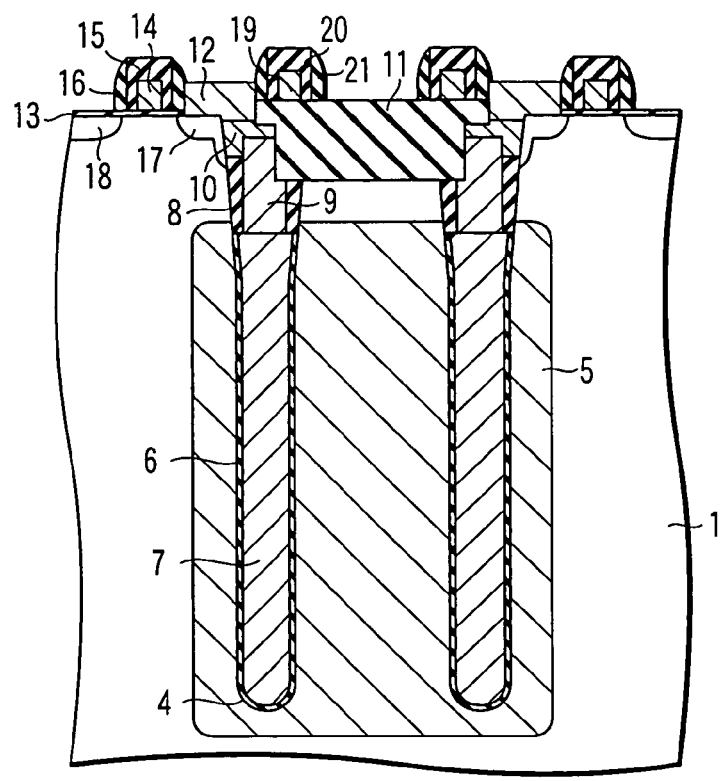
FIG. 1 is a sectional view showing the essential portion of a semiconductor memory device according to a first embodiment of the present invention.

Embodiments of the present invention will be described with reference to the drawings. In the following description, like reference numerals are used to designate like structural elements having the same functions, and explanation is repeated if necessary.

First Embodiment

FIG. 1 is a sectional view showing the essential portion of a semiconductor memory device according to the first embodiment of the present invention.

In a semiconductor substrate 1 formed of, for example, silicon, a trench 4 is formed. In the semiconductor substrate 1 and around the lower portion of the trench 4, a plate electrode 5 formed of an N-type diffusion layer and serving as a capacitor electrode is provided. On the lower inner surface of the trench 4, for example, a silicon nitride film is formed in contact with the plate electrode 5. On the surface of the silicon nitride film, a silicon oxide film is formed. Both the silicon nitride film and the silicon oxide film form the dielectric film (that is, an NO film 6) of a capacitor.

Inside the NO film 6 of the trench 4, a polysilicon layer 7 is formed and serves as the upper electrode of a capacitor. The polysilicon layer 7 is formed by burying As-doped amorphous silicon. On the polysilicon layer 7 and along the upper inner surface of the trench 4, a collar oxide film 8 is formed in order to electrically separate a transistor region to be formed in the semiconductor substrate 1 from the storage node of the trench capacitor. In the trench 4 and on a side surface of the collar oxide film 8, a polysilicon layer 9 serving as a wiring layer is provided so as to be in contact with the polysilicon layer 7. The polysilicon layer 9 is formed by burying As-doped amorphous silicon.

On the polysilicon layer 9, a BS contact layer 10 serving as a contact layer is formed, which connects between a source diffusion layer 17 of a memory cell transistor and the polysilicon layer 9, by burying, for example, As-doped amorphous silicon in the trench 4 until it is flush with the surface of the semiconductor substrate 1.

Near the surface of the semiconductor 1, an element-isolating region 11 is formed to electrically separate between adjacent trench capacitors. On the semiconductor substrate 1, a gate electrode 14 is formed with a gate insulating film 13 interposed between them. Around the gate electrode 14, a gate cap insulating film 15 is formed so as to cover the gate electrode 14. On the both side surfaces of the gate cap insulating film 15, a gate sidewall insulating film 16 is formed. In the semiconductor substrate 1 underneath both sides of the gate electrode 14, a source diffusion layer 17 and a drain diffusion layer 18 are formed. To the drain diffusion layer 18, for example, a bit line (not shown) is connected.

On the element-isolating region 11, a pass gate electrode 19 forming another memory cell transistor is formed. To the pass gate electrode 19, a gate cap insulating film 20 and a gate sidewall insulating film 21 are provided. The gate electrode 14 and pass gate electrode 19 serve as word lines.

On the source diffusion layer 17 and the BS contact layer 10, an SS contact layer 12 is formed. The SS contact layer 12 serves as the contact layer between the source diffusion layer 17 and the polysilicon layer 9 and is formed by burying amorphous silicon doped with, for example, phosphorus (P). In the manner mentioned above, the semiconductor memory device shown in FIG. 1 is constructed.

Next, a method of manufacturing the semiconductor memory device shown in FIG. 1 will be described with reference to FIGS. 1 to 5.

Figure 2:
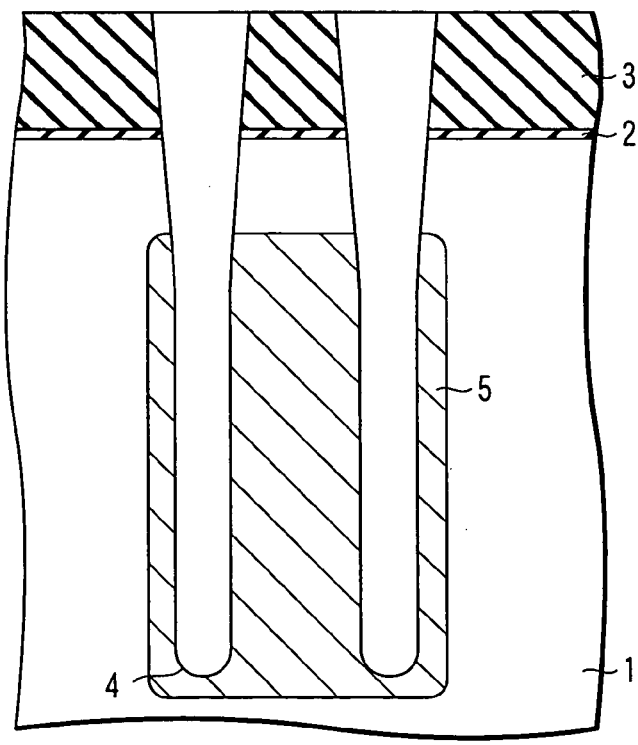
FIG. 2 is a sectional view illustrating manufacturing steps of the semiconductor memory device shown in FIG. 1.

In FIG. 2, a silicon oxide film 2 of about 20 Å thick is formed on the semiconductor substrate 1. On the silicon oxide film 2, a silicon nitride film 3 of about 2200 Å thick is formed. Subsequently, the trench 4 is formed so as to reach the semiconductor substrate 1. The trench 4 is formed by a photolithographic method and a dry-etching method so as to have an aperture and depth of predetermined sizes.

Subsequently, N-type impurity ions (e.g., As) are diffused in the semiconductor substrate 1 to form the plate electrode 5. More specifically, silicate glass doped with As is deposited in the semiconductor substrate 1 and the resultant semiconductor is subjected to annealing at a high temperature of 1000° C. or more to diffuse As in the semiconductor substrate 1. In this manner, the plate electrode 5 is formed. Thereafter, the silicate glass is removed from the trench 4. The plate electrode 5 is formed so as to cover the trench 4, which is formed at a depth of 1.5 μm or more from the surface of the semiconductor substrate 1.

Figure 3:
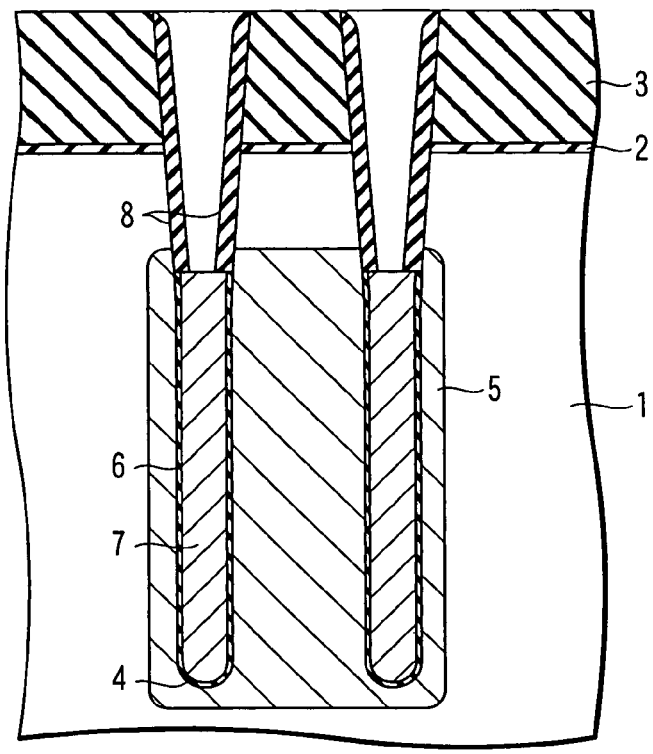
FIG. 3 is a sectional view illustrating the manufacturing steps subsequent to the steps shown in FIG. 2.

Subsequently, in FIG. 3, the NO film 6 of about 20 to 30 Å thick, which serves as the dielectric film of a capacitor, is formed on the lower inner portion of the trench 4. To explain more specifically, the semiconductor substrate 1 forming the inner surface of the trench 4 is thinly nitrided to produce a silicon nitride film, the surface of which is further thinly oxidized. In this manner, the NO film 6 is formed on the inner surface (being the semiconductor substrate 1) of the trench 4. Subsequently, the polysilicon layer 7 serving as the upper electrode of a capacitor is formed. The polysilicon layer 7 is formed by depositing As-doped amorphous silicon on the NO film 6. The polysilicon layer 7 and the NO film 6 are etched back to a depth of about 0.1 μm from the surface of the semiconductor substrate 1.

In the next step, an oxide film (not shown) of about 60 Å thick is formed on the polysilicon layer 7 and along the inner surface of the trench 4 by a thermal oxidation method. Subsequently, the collar oxide film 8 of about 300 Å thick is deposited on the oxide film. Thereafter, the collar oxide film 8 formed on the polysilicon layer 7 is partly removed to form an opening portion for forming the contact layer to the polysilicon layer 7.

Figure 4:
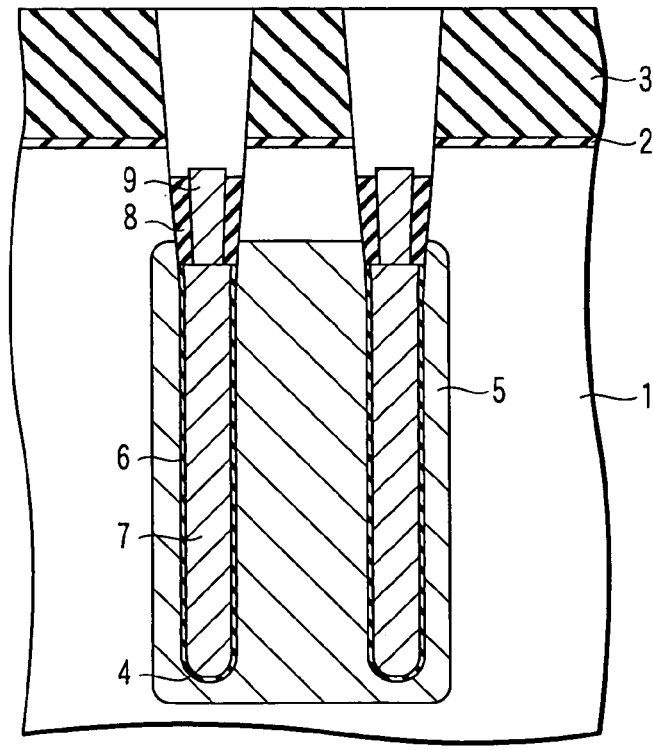
FIG. 4 is a sectional view illustrating the manufacturing steps subsequent to the steps shown in FIG. 3.

Next, in FIG. 4, As-doped amorphous silicon is deposited inside the collar oxide film 8 and on the polysilicon layer 7 to form the polysilicon layer 9. The polysilicon layer 9 is etched back to a depth of about 300 Å from the surface of the semiconductor substrate 1. Furthermore, the collar oxide film 8 is etched back by a wet etching method to a depth of about 500 Å from the surface of the semiconductor substrate 1. This step is performed to sufficiently expose the polysilicon layer 9.

Figure 5:
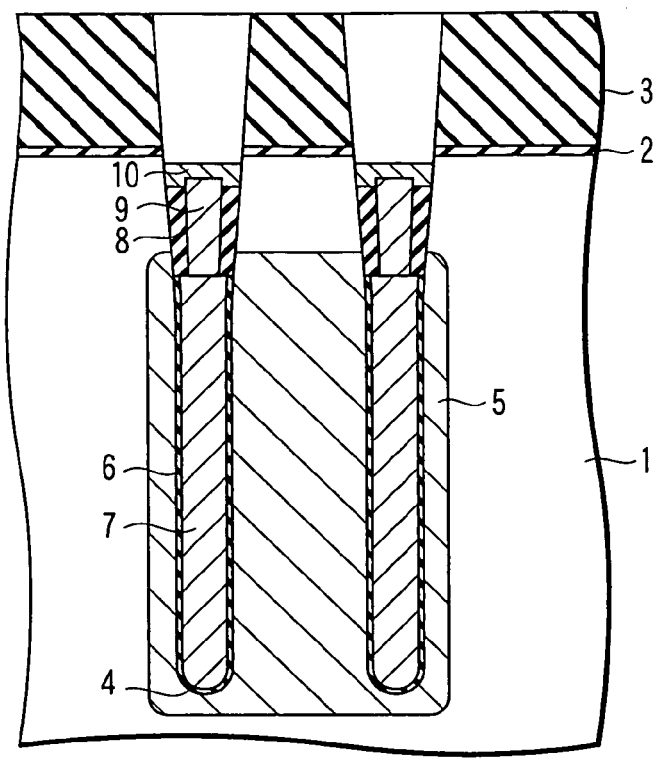
FIG. 5 is a sectional view illustrating the manufacturing step subsequent to the step shown in FIG. 4.

In FIG. 5, As-doped amorphous silicon is deposited on the polysilicon layer 9 in the trench 4 to form the BS contact layer 10. The BS contact layer 10 is etched back until it is flush with the surface of the semiconductor substrate 1.

Next, the element-isolating region is formed in and on the semiconductor substrate 1 to electrically isolate adjacent elements. More specifically, in the region around which the element-isolating region is to be formed, a photoresist (not shown) for forming a shallow trench isolation (STI) is formed by a photolithographic method. Using the photoresist as a mask, the collar oxide film 8, polysilicon layer 9, BS contact layer 10, and semiconductor substrate 1 are removed from the region for the STI by etching and further an insulating film (silicon oxide film) is buried in an element isolation groove, thereby forming the element-isolating region 11. By virtue of the element isolation region, adjacent trench capacitors are isolated from each other. Subsequently, a transistor is formed in accordance with conventional manufacturing steps.

Next, in FIG. 1, the trench top oxide (TTO) film formed on the top of the trench capacitor and the insulating film formed on the source diffusion layer 17 and drain diffusion layer 18 is etched back. And, the SS contact layer 12 of about 1500 Å thick is formed on the surface of the semiconductor substrate 1 so as to be in contact with the BS contact layer 10 and the source diffusion layer 17. The SS contact layer 12 is formed by depositing phosphorus-doped amorphous silicon on the source diffusion layer 17 and BS contact layer 12 with the gate sidewall insulating films 16, 21, and the element-isolating region 11 as a mask. In this manner, the semiconductor memory device shown in FIG. 1 is formed.

The semiconductor memory device thus constructed has the BS contact layer 10 buried in the semiconductor substrate 1 and the SS contact layer 12 formed on the surface of the semiconductor substrate 1 as a strap contact layer connecting to the wiring layer (polysilicon layer 9) in contact with the upper electrode (polysilicon layer 7) of a trench capacitor and the source diffusion layer 17 of the memory cell transistor. Therefore, the area of the source diffusion layer 17 in contact with the strap contact layer can be increased.

As the size of the memory cell transistor is reduced, the frontage of the BS contact layer 10 on the side of the source diffusion layer 17 decreases, with the result that the contact area between the BS contact layer 10 and the source diffusion layer 17 decreases. However, the semiconductor memory device according to this embodiment has the SS contact layer 12, which prevents the contact resistance value between the strap contact layer and the source diffusion layer 17 from increasing. Furthermore, when the collar oxide film 8 is etched back in order to keep the size of the frontage of the BS contact layer 10, it is not necessary to adjust the depth of the collar oxidation film 8.

According to the embodiment mentioned above, since the contact area between the source diffusion layer 17 and the strap contact layer can be increased, the contact resistance value can be reduced.

Even if the frontage of the BS contact layer is varied by changing the distance between the surface of the collar oxide film 8 from the surface of the semiconductor substrate 1, the contact resistance value can be less affected. Therefore, the distance between the upper surface of the collar oxide film 8 and the surface of the semiconductor substrate 1 can be reduced.

Furthermore, in this embodiment, it is possible to suppress poor workability when polysilicon is buried in a recess in the upper portion of the collar oxide film 8, that is, in the sidewall of the trench 4, as compared to the case where the SS contact layer alone is formed.

Also, in this embodiment, after the BS contact layer 10 is formed, the SS contact layer 12 is formed. More specifically, the BS contact layer 10 and the SS contact layer 12 are formed in different steps. When the BS contact layer and SS contact layer are simultaneously buried and formed as a single SS contact layer, the collar oxide film 8 is etched together with the TTO film at the time the TTO film is etched back. Therefore, the controllability of etching back step for the collar oxide film 8 degrades. However, in the embodiment, after the polysilicon layer 9 is formed, the collar oxide film 8 alone is etched back by a wet etching method. Therefore, it is possible to etch back the collar oxide film 8 with good controllability. Therefore, since the depth of the BS contact layer 10 which is formed on the collar oxide film 8 can be uniform, the performance variation of the semiconductor memory device can be reduced.

Second Embodiment

Figure 6:
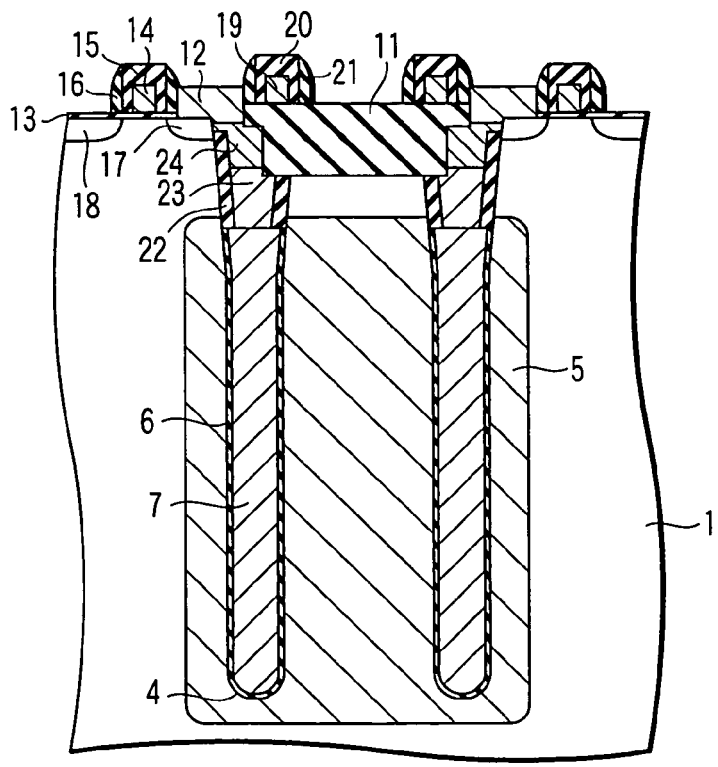
FIG. 6 is a sectional view showing the essential portion of a semiconductor memory device according to a second embodiment of the present invention.

FIG. 6 is a sectional view showing the essential portion of a semiconductor memory device according to the second embodiment of the present invention.

On the polysilicon layer 7, a collar oxide film 22 is formed along the inner surface of the trench 4 in order to separate the transistor region to be formed in the semiconductor substrate 1 from the storage node of the trench capacitor. Inside the collar oxide film 22 and on of the polysilicon layer 7, a polysilicon layer 23 is formed which serves as a wiring layer in contact with the polysilicon layer 7. Note that the collar oxide film 22 is formed such that the upper surface of the collar oxide film 22 is higher than that of the polysilicon layer 23.

On the polysilicon layer 23, a BS contact layer 24 serving as the contact layer between the source diffusion layer 17 of a memory cell transistor and the polysilicon layer 23 is formed such that the upper surface of the BS contact layer 24 is flush with that of the semiconductor substrate 1. On the source diffusion layer 17 and the BS contact layer 24, the SS contact layer 12 is formed which serves as the contact layer between the source diffusion layer 17 and polysilicon layer 23.

Next, a method of manufacturing the semiconductor memory device shown in FIG. 6 will be described with reference to FIGS. 6 and 7.

Figure 7:
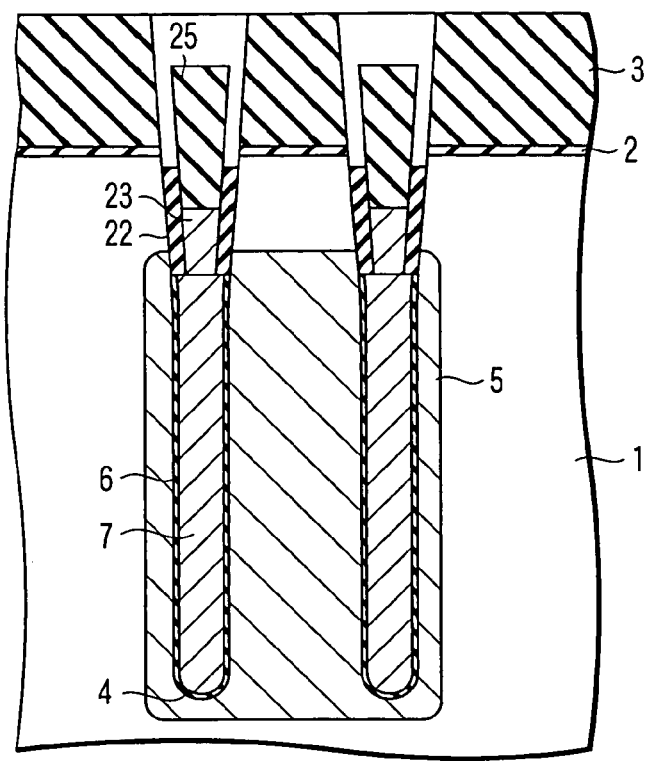
FIG. 7 is a sectional view of the semiconductor memory device shown in FIG. 6 for illustrating a manufacturing method thereof.

In FIG. 7, on the polysilicon layer 7 within the trench 4, the collar oxide film 22 of about 300 Å thick is deposited. The collar oxide film 22 on the polysilicon layer 7 is partially removed by a dry-etching method to form an opening portion for forming a contact layer to the polysilicon layer 7.

Subsequently, As-doped amorphous silicon is deposited on the collar oxide film 22 and the polysilicon layer 7 within the trench 4 to form the polysilicon layer 23. The polysilicon layer 23 is etched back from the surface of the semiconductor substrate 1 to a depth of about 800 Å.

Next, photoresist 25 is coated on the polysilicon layer 23 within the trench 4 and etched back to an appropriate depth, for example, to a depth of 500 Å from the surface of the silicon nitride film 3). Subsequently, the collar oxide film 22 is etched by a wet-etching method to a depth of about 600 Å from the surface of the semiconductor substrate 1. Thereafter, the photoresist 24 within the trench 4 is completely removed. In this manner, the upper surface of the polysilicon layer 23 is fully exposed.

Next, in FIG. 6, As-doped amorphous silicon is deposited within the trench 4, thereby forming the BS contact layer 24, which is then etched back until it is flush with the surface of the semiconductor substrate 1. Thereafter, the same steps as in the first embodiment are repeated.

In the semiconductor memory device thus constructed, the upper surface of the collar oxide film 22 is formed higher than that of the polysilicon layer 23. By virtue of this, a recess portion cannot be formed in the upper portion of the collar oxide film 22 although it is formed in a conventional semiconductor memory device.

Furthermore, the semiconductor memory device thus constructed has the BS contact layer 24 buried in the semiconductor substrate 1 and the SS contact layer 12 formed on the surface of the semiconductor substrate 1, as the strap contact layer between the wiring layer (polysilicon layer 23) in contact with the upper electrode (polysilicon layer 7) of the trench capacitor and the source diffusion layer 17 of the memory cell transistor. By virtue of this, the contact area between the source diffusion layer 17 and the strap contact layer can be increased.

As described above, according to this embodiment, since the contact area between the source diffusion layer 17 and the strap contact layer can be increased, the contact resistance value can be decreased.

Furthermore, since the recess portion is not formed in the upper portion of the collar oxide film 22, the workability of burying polysilicon in forming the BS contact layer 24 can be improved. As a result, the BS contact layer is free from voids and the like, preventing a film from peeling off and the resistance value of the BS contact layer from increasing.

In the method of manufacturing a semiconductor memory device according to this embodiment, after the photoresist 25 is coated on polysilicon layer 23 within the trench 4, the collar oxide film 22 is etched. In this manner, the upper surface of the collar oxide film 22 is formed higher than that of polysilicon layer 23.

Third Embodiment

In the third embodiment, a semiconductor memory device having the same structure as that shown in FIG. 6 is formed in a different manufacturing method.

Figure 8:
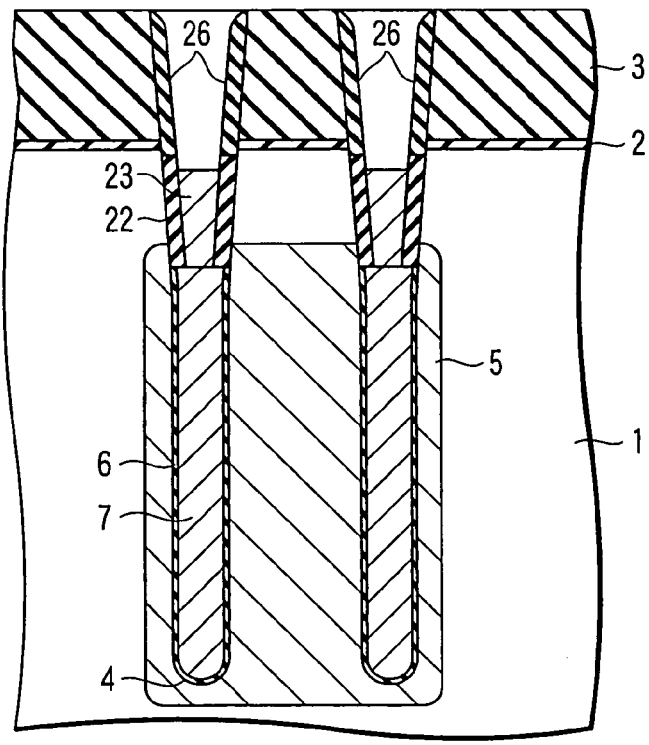
FIG. 8 is a sectional view illustrating manufacturing steps of the semiconductor memory device according to a third embodiment of the present invention.
Figure 9:
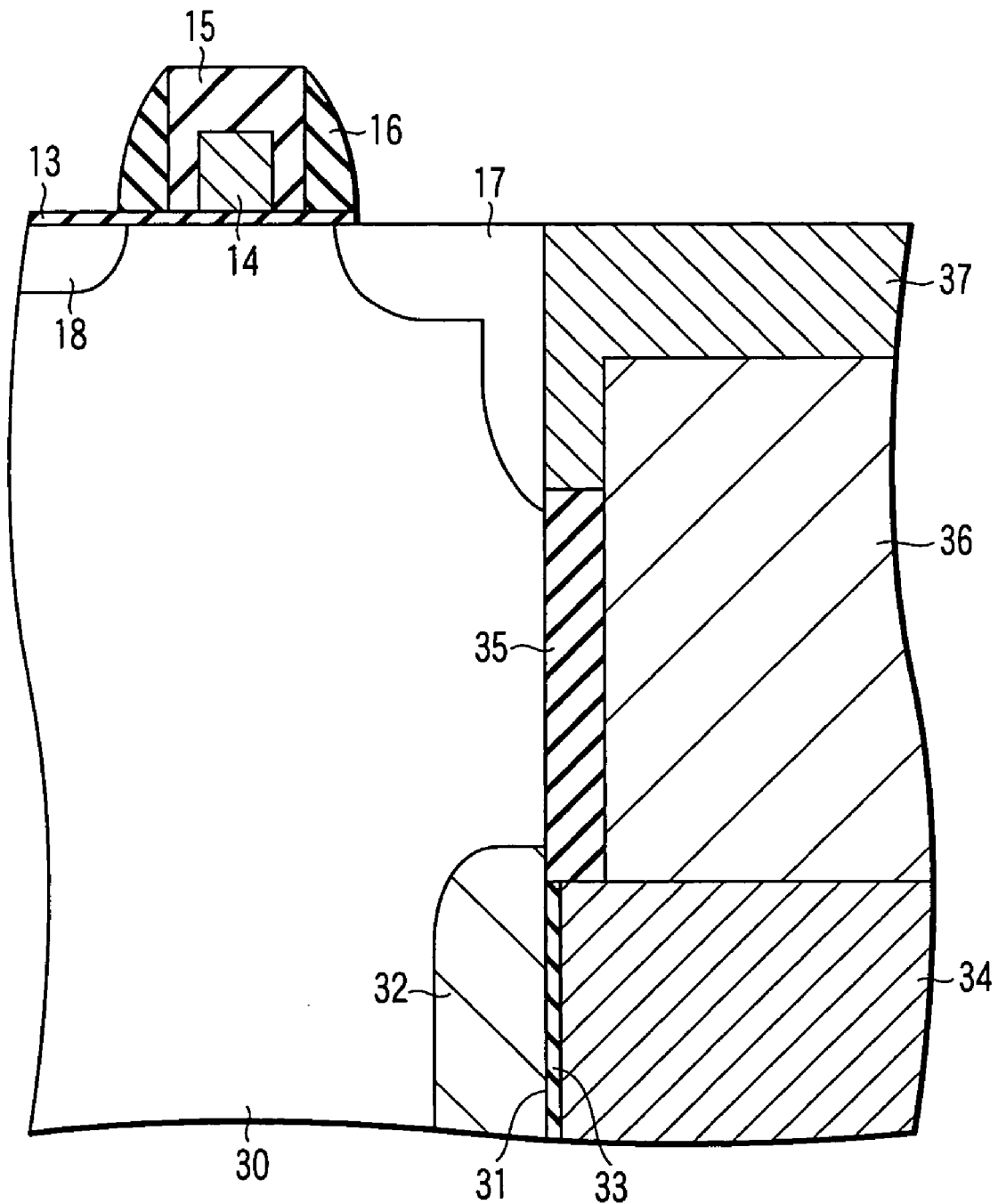
FIG. 9 is a sectional view showing the essential portion of a conventional DRAM.

FIG. 8 is a sectional view showing the essential portion of a semiconductor memory device shown in FIG. 6 for illustrating a manufacturing method according to a third embodiment. The method of manufacturing a semiconductor memory device shown in FIG. 6 will be explained below with reference to FIGS. 6 and 8.

In FIG. 8, on the polysilicon layer 7 within the trench 4, the collar oxide film 22 is deposited with a thickness of about 300 Å. The collar oxide film 22 formed on the polysilicon layer 7 is partially removed to form an opening portion for forming a contact layer to the polysilicon layer 7.

Subsequently, As-doped amorphous silicon is deposited inside the collar oxide film 22 of the trench 4 to form the polysilicon layer 23, which is then etched back to a depth of about 500 Å from the surface of the semiconductor substrate 1. Subsequently, the collar oxide film 22 is etched by a wet etching method to a depth of about 600 Å from the surface of the semiconductor substrate 1.

Next, a boron silicate glass (BSG) oxide film 26 of about 300 Å thick is deposited on the collar oxide film 22 within the trench 4. A oxide film formed on the polysilicon layer 23 is removed by a dry-etching method. Furthermore, the polysilicon layer 23 is etched back again to a depth of about 800 Å from the surface of the semiconductor substrate 1. In this manner, the upper surface of the polysilicon layer 23 can be fully exposed.

Next, in FIG. 6, after the BSG oxide film 26 is removed, As-doped amorphous silicon is deposited within the trench 4 to form the BS contact layer 24, which is further etched back until it is flush with the surface of the semiconductor substrate 1. Thereafter, the same steps as in the first embodiment are repeated.

In the semiconductor memory device thus constructed, the top portion of the collar oxide film 22 is formed higher than the top portion of the polysilicon layer 23. As a result, a recess portion cannot be formed although it is formed in the upper portion of the collar oxide film 22 by a conventional method. Other than this, the same effects as in the second embodiment can be obtained in this embodiment.

In the method of manufacturing a semiconductor memory device according to this embodiment, the collar oxide film 22 is etched and the BSG oxide film 26 is formed on the collar oxide film 22 in the trench 4, and thereafter, the polysilicon layer 23 is etched. In this manner, the upper surface of the polysilicon layer 23 is formed lower than that of the collar oxide film 22.

As the oxide film to be formed on the collar oxide film 22, the BSG oxide film 26 is used. More specifically, the oxide film having etch selectivity to the collar oxide film 22 is used. As a result, it is possible to avoid etching of the collar oxide film 22 when the BSG oxide film 26 is etched.

Additional advantages and modifications will readily occur to those skilled in the art. Therefore, the invention in its broader aspects is not limited to the specific details and representative embodiments departing from the spirit or scope of the general inventive concept as defined by the appended claims and their equivalents.

What is claimed is:

1. A semiconductor memory device comprising:
   a semiconductor substrate;
   a trench formed in the semiconductor substrate;
   a diffusion layer for a first electrode, formed in the semiconductor substrate so as to be in contact with an inner surface of the trench;
   a capacitor insulating film formed on the first electrode exposed as the inner surface of the trench;

a conductive layer for a second electrode, formed on the capacitor insulating film so as to bury a lower portion of the trench;

a first insulating film formed on the second electrode and along a side surface of the trench;

a first conductive layer formed on a side surface of the first insulating film and on the second electrode so as to bury an intermediate portion of the trench;

a first contact layer formed on the first insulating film and on the first conductive layer so as to bury an upper portion of the trench, the first contact layer being formed of a conductive material;

a second contact layer formed on an upper surface of the semiconductor substrate and on the first contact layer, the second contact layer being formed of a conductive material; and a transistor having a source and a drain formed in the semiconductor substrate, the source or the drain being in contact with the first and second contact layers.

2. The semiconductor memory device according to claim 1, wherein the upper surface of the first conductive layer is positioned lower than that of the first insulating film.

3. The semiconductor memory device according to claim 1, wherein the first conductive layer, the first contact layer and the second contact layer are formed of silicon doped with a first conductivity-type impurity.

4. The semiconductor memory device according to claim 1, wherein:

the first conductive layer and the first contact layer are formed of silicon doped with arsenic (AS); and the second contact layer is formed of silicon doped with phosphorus (P).

5. The semiconductor memory device according to claim 1, further comprising an element-isolating region formed in the semiconductor substrate and around a region in which a semiconductor element is to be formed.

6. The semiconductor memory device according to claim 1, wherein the diffusion layer is of a first conductivity-type.

7. The semiconductor memory device according to claim 1, wherein the transistor includes:

a gate electrode formed on the semiconductor substrate between the source and the drain via a gate insulating film; and a sidewall insulating film formed on both sides of the gate electrode.

8. The semiconductor memory device according to claim 7, wherein the second contact layer is in contact with a side surface of the sidewall insulating film.

9. The semiconductor memory device according to claim 1, wherein the first and second contact layers are formed of a semiconductor material of a first conductivity-type.

10. The semiconductor memory device according to claim 9, wherein the first conductivity-type is an N-type.

11. The semiconductor memory device according to claim 9, wherein the first conductive layer is formed of a semiconductor material of the first conductivity-type.

* * * * *